United States Patent
Douskey

(10) Patent No.: US 7,472,324 B2
(45) Date of Patent: Dec. 30, 2008

(54) LOGIC BUILT-IN SELF-TEST CHANNEL SKIPPING DURING FUNCTIONAL SCAN OPERATIONS

(75) Inventor: Steven M. Douskey, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 320 days.

(21) Appl. No.: 11/461,806

(22) Filed: Aug. 2, 2006

(65) Prior Publication Data

US 2008/0052581 A1    Feb. 28, 2008

(51) Int. Cl.
  *G01R 31/28*    (2006.01)
(52) U.S. Cl. ........................ 714/733; 714/729
(58) Field of Classification Search ........................ None
  See application file for complete search history.

(56) References Cited

U.S. PATENT DOCUMENTS 5,983,380 A * 11/1999 Motika et al. ................ 714/733
6,370,664 B1 * 4/2002 Bhawmik .................... 714/729
6,993,694 B1 * 1/2006 Kapur et al. ................. 714/733

* cited by examiner

*Primary Examiner*—Christine T Tu
(74) *Attorney, Agent, or Firm*—Cantor Colburn LLP

(57) ABSTRACT

A method and system for built-in self-testing architecture, including: a logic built-in self-test (LBIST) controller in operable communication with a pseudo-random pattern generator; a multiple input signature register in operable communication with a plurality of scan channels; and circuitry in operable communication with the pseudo-random pattern generator and the multiple input signature register, wherein the circuitry includes a channel skip function which allows selection of any combination of scan channels to skip while scanning.

6 Claims, 2 Drawing Sheets

LOGIC BUILT-IN SELF-TEST CHANNEL SKIPPING DURING FUNCTIONAL SCAN OPERATIONS

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

The present invention relates to logic built-in self-tests, and more particularly to logic built-in self-tests including channel skipping functions.

2. Description of Background

A logic built-in self-test (LBIST) architecture used to apply patterns and observe responses on a chip is the self-test using a multiple input signature register (MISR) and a parallel shift (Stumps) register sequence generator. The basic mechanism uses a pseudo-random pattern generator (PRPG) to generate the inputs of a device's internal scan chain, initiate a functional cycle to capture the response of the device, and then compress the captured response into a MISR. The compressed response that is output from the MISR is referred to as a signature. Any corruption in the outputted signature indicates a defect in the device.

Many computer systems require scan path access for chip initialization and diagnostics. Occasionally the scan path may contain a design or manufacturing error that blocks the scan path. These errors can be difficult to debug because the scan paths are often very large and every latch in front of the blockage is not observable, and those after the blockage are not loadable. When a specific scan ring value, or channel, is required for initialization after the blockage this problem could completely disable the part.

Considering the above limitations, a method and architecture for LBIST channel skipping during functional scan operations is desired.

SUMMARY OF THE INVENTION

The shortcomings of the prior art are overcome and additional advantages are provided through the provision of a system for built-in self-testing architecture, the system comprising: a logic built-in self-test (LBIST) controller in operable communication with a pseudo-random pattern generator; a multiple input signature register in operable communication with a plurality of scan channels; and circuitry in operable communication with the pseudo-random pattern generator and the multiple input signature register, wherein the circuitry includes a channel skip function which allows selection of any combination of scan channels to skip while scanning.

The shortcomings of the prior art are overcome and additional advantages are provided through the provision of a method for built-in self-testing architecture, the method comprising: providing a logic built-in self-test (LBIST) controller in operable communication with a pseudo-random pattern generator; providing a multiple input signature register in operable communication with a plurality of scan channels; and providing circuitry in operable communication with the pseudo-random pattern generator and the multiple input signature register, wherein the circuitry includes a channel skip function which allows selection of any combination of scan channels to skip while scanning.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution, which provides LBIST channel skipping during functional scan operations.

BRIEF DESCRIPTION OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

Figure 1:
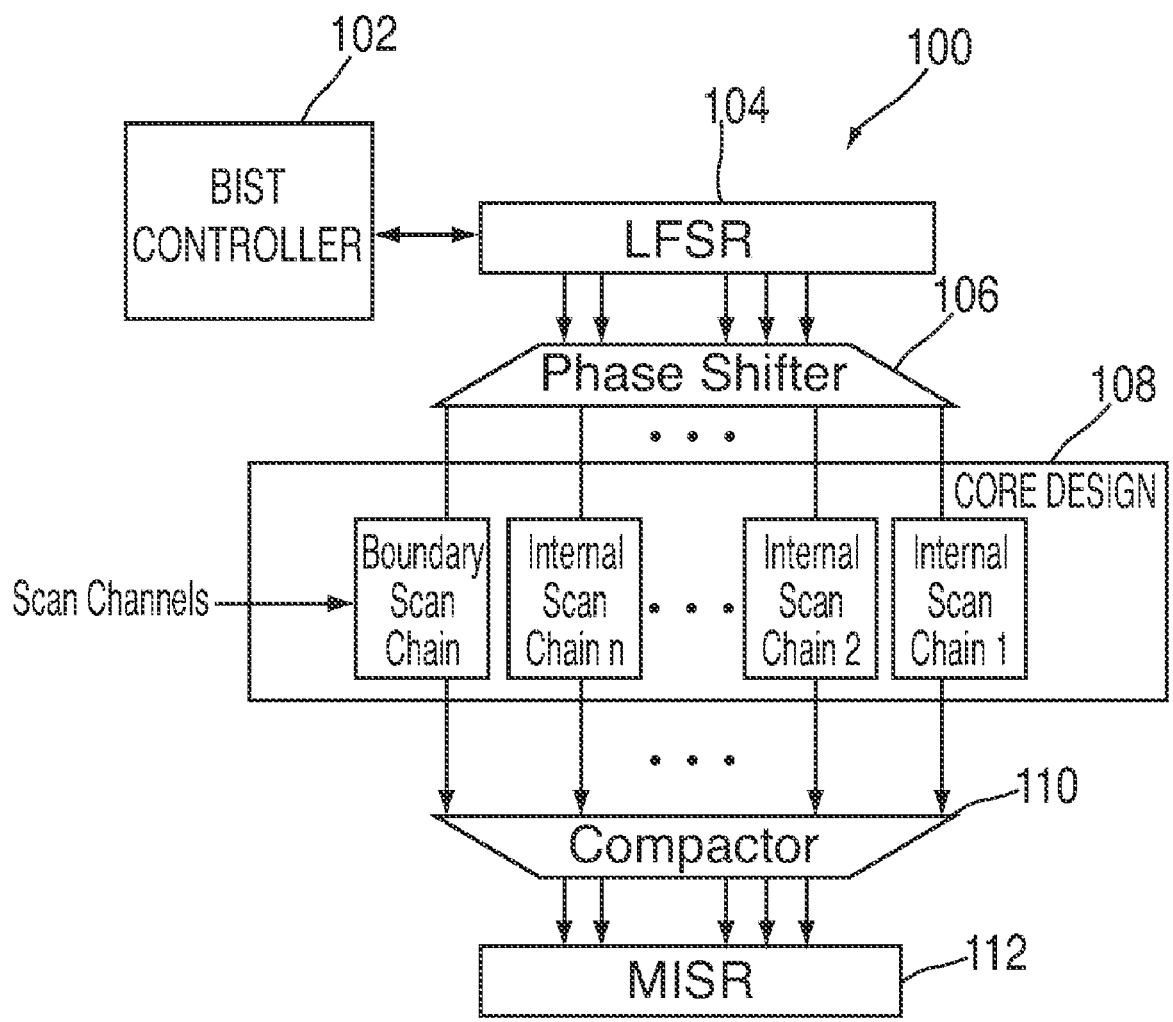
FIG. 1 illustrates one example of an LBIST architecture in accordance with exemplary embodiments of the present invention.

The detailed description explains the preferred embodiments of the invention, together with advantages and features, by way of example with reference to the drawings.

DETAILED DESCRIPTION OF THE INVENTION

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention in detail. The examples used herein are intended merely to facilitate an understanding of ways in which the invention may be practiced and to further enable those of skill in the art to practice the invention. Accordingly, the examples should not be construed as limiting the scope of the invention.

Referring to FIG. 1, an LBIST architecture is generally depicted as 100. The LBIST architecture 100 includes an LBIST controller 102, a pseudo-random pattern generator/linear feedback shift register (PRPG/LFSR) 104, a multiple input signature register (MISR) or phase shifter 106, one or more scan chains 108, also referred to as channels, a compactor 110, and a MISR 112. The compactor 110 may be any simple combinational circuitry between the channels 108, the PRPG 104, and the MISR 112.

The LBIST architecture 100 works on the principal that random patterns generated with a state machine—the LFSR 104 exposes faults in the circuit under test. Given a starting state (or seed pattern), the LFSR 104 cycles through a predictable but randomized sequence of states. The logic stimulus that is derived from these states is shifted into the scan channels 108 through a spreader network that is usually constructed of XORs. The values in the scan channels 108 represent the stimulus portion of the test pattern.

During one or more clock pulses, the response is captured in the scan channels 108. The captured response is then shifted from the scan channels 108, through the compactor 110, and into another state machine, the MISR 112. Many such tests are applied, and the scan-in operation of a test pattern is overlapped with the scan-out operation of the previous test pattern. After the tests are applied-provided the circuitry 110 was free of defects—the MISR 106 that was initialized to a known state can be expected to be at another known state. Any other state reached by the MISR 106 at the end of the test indicates defects in the circuit under test.

In the exemplary embodiments, one or more natural scan ring divisions may be required for a LBIST to allow more observe-ability and control of the scan rings can be used to help minimize the impact off a scan blockage. In other exemplary embodiments, this can also be accomplished with no additional scan clocks or ring selects.

One approach to reducing the number of blockages in scan rings is to create more and smaller scan rings. An increase in the number of scan rings would normally require more scan clocks, ring selects, and scan path multiplexing. The LBIST design already breaks the scan rings into many smaller sections, referred to as channels. These channels are fed from a PRPG, and to a MISR for testing, but can be used to help diagnostics as well.

Figure 2:
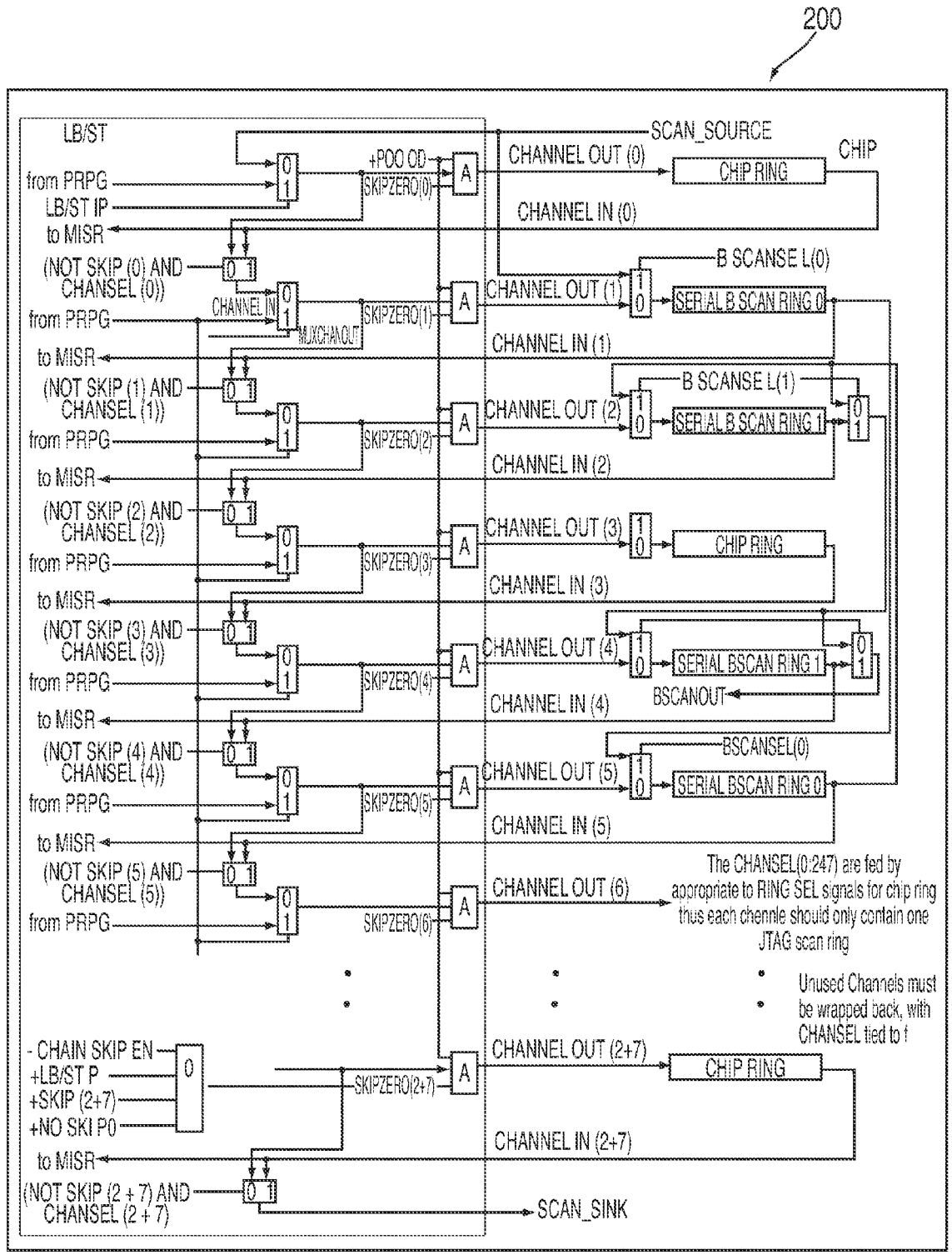
FIG. 2 illustrates one example of a portion of an LBIST architecture including functions a channel skipping function in accordance with exemplary embodiments of the present invention.

Referring to FIG. 2, a portion of an LBIST architecture 200 is depicted that illustrates a gating scheme that allows reusing some of the LBIST functions for the channel skipping function. The channel skip function allows selection of any combination of channels to skip while scanning.

In the exemplary embodiments of the present invention, the MISR masking register is reused and enabled with an LBIST option register bit. It should be noted that the channels being skipped still have their scan clocks running during scan (no additional scan clocks were created for this function). These channels are effectively stubs off of the selected ring and will fill with data from the scan at least up to the failing point in that channel.

An additional SKIPZERO function can be enabled, with an LBIST options register bit. The SKIPZERO function gates a zero to the beginning of all skipped channels. Should initialization data be needed in these channels before a blockage, it is possible to leave the stub loading data, but program accordingly. Also with this individual channel control available, the power good flush ring control may be moved here. Controlling the channel inputs speeds the flush time from the previous scan ring based design. This may not have been too noticeable in the actual hardware, but simulation initialization becomes much quicker.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A system for built-in self-testing architecture, the system comprising:
   a logic built-in self-test (LBIST) controller in operable communication with a pseudo-random pattern generator;
   a multiple input signature register in operable communication with a plurality of scan channels; and
   circuitry in operable communication with the pseudo-random pattern generator and the multiple input signature register, wherein the circuitry includes a channel skip function which allows selection of any combination of scan channels to skip while scanning.

2. The system of claim 1, wherein the circuitry includes one or more XOR gates.

3. The system of claim 2, wherein the circuitry further includes a skip zero function that gates a zero to a beginning of all skipped channels.

4. A method for built-in self-testing architecture, the method comprising:
   providing a logic built-in self-test (LBIST) controller in operable communication with a pseudo-random pattern generator;
   providing a multiple input signature register in operable communication with a plurality of scan channels; and
   providing circuitry in operable communication with the pseudo-random pattern generator and the multiple input signature register, wherein the circuitry includes a channel skip function which allows selection of any combination of scan channels to skip while scanning.

5. The method of claim 4, wherein the circuitry includes one or more XOR gates.

6. The method of claim 5, wherein the circuitry further includes a skip zero function that gates a zero to a beginning of all skipped channels.

* * * * *